(12) United States Patent
Endo et al.

(10) Patent No.: US 8,634,007 B2
(45) Date of Patent: Jan. 21, 2014

(54) SOLID-STATE IMAGING DEVICE, METHOD OF MANUFACTURING THE SAME, IMAGE CAPTURING APPARATUS, SEMICONDUCTOR DEVICE, AND METHOD OF MANUFACTURING THE SAME

(75) Inventors: Suzunori Endo, Kumamoto (JP); Takashi Abe, Kanagawa (JP)

(73) Assignee: Sony Corporation (JP)

( * ) Notice: Subject to any disclaimer, the term of this patent is extended or adjusted under 35 U.S.C. 154(b) by 483 days.

(21) Appl. No.: 12/945,225

(22) Filed: Nov. 12, 2010

(65) Prior Publication Data

US 2011/0128429 A1    Jun. 2, 2011

(30) Foreign Application Priority Data

Nov. 30, 2009   (JP) .................... 2009-271642

(51) Int. Cl.
*H04N 3/14*         (2006.01)
(52) U.S. Cl.
USPC ........................................... 348/294

(58) Field of Classification Search
USPC .................................................. 348/294, 308
See application file for complete search history.

(56) References Cited

U.S. PATENT DOCUMENTS

| | | | | |
|---|---|---|---|---|
| 5,942,774 | A * | 8/1999 | Isogai et al. | 257/292 |
| 5,955,753 | A * | 9/1999 | Takahashi | 257/292 |
| 8,183,603 | B2 * | 5/2012 | Yamaguchi et al. | 257/223 |
| 8,289,427 | B2 * | 10/2012 | Kawahito | 348/302 |
| 2006/0066741 | A1 * | 3/2006 | Koizumi et al. | 348/308 |
| 2008/0290382 | A1 * | 11/2008 | Hirota | 257/291 |
| 2010/0020212 | A1 * | 1/2010 | Koizumi et al. | 348/294 |
| 2011/0032405 | A1 * | 2/2011 | Nozaki et al. | 348/308 |

FOREIGN PATENT DOCUMENTS

JP      2003-031785      1/2003

* cited by examiner

*Primary Examiner* — James Hannett
(74) *Attorney, Agent, or Firm* — Sheridan Ross P.C.

(57) ABSTRACT

A solid state imaging device including a semiconductor substrate; at least one light sensing portion with a charge accumulating portion in the semiconductor substrate; and a dielectric layer over an induced layer of the semiconductor substrate adjacent to the charge accumulation portion, the induced layer being induced by the dielectric layer.

23 Claims, 12 Drawing Sheets

SOLID-STATE IMAGING DEVICE, METHOD OF MANUFACTURING THE SAME, IMAGE CAPTURING APPARATUS, SEMICONDUCTOR DEVICE, AND METHOD OF MANUFACTURING THE SAME

RELATED APPLICATION DATA

The present application claims priority to Japanese Priority Patent Application JP 2009-271642, filed in the Japan Patent Office on Nov. 30, 2009, which is incorporated herein by reference in its entirety.

BACKGROUND OF THE INVENTION

The present invention relates to a solid-state imaging device, a method of manufacturing the same, an image capturing apparatus, a semiconductor device, and a method of manufacturing the same, and more particularly, to a solid-state imaging device in which a dielectric film inducing a predetermined charge region is formed on the surface of a semiconductor substrate, a method of manufacturing the same, an image capturing apparatus, a semiconductor device, and a method of manufacturing the same.

With high integration of a semiconductor device, a packaging density has a tendency to increase by further reducing a transistor and another semiconductor device. Therefore, in a CMOS sensor (CMOS solid-state imaging device), it is necessary for pixels to become minute for high integration of the device.

However, a CMOS sensor according to a related art has a configuration in which a light sensing portion receives and detects light from a lens formed in a wiring section via a space between wiring layers. Therefore, as the pixels become minuter with high integration of the device, the shading of the incident light occurs by obstacles such as the wiring layer, the aperture ratio of the light-receiving sensor is decreased, and thus sufficient light may not be emitted to the light sensing portion. For this reason, sensitivity may deteriorate or shading may be increased.

By illuminating the light-receiving sensor with light from the rear surface side (opposite opposite side to the wiring section), the effective aperture ratio of 100% can be achieved without the influence of the obstacles such as the wiring layers, thereby considerably increasing the sensitivity.

In order to achieve this, a CMOS sensor having a configuration in which the light-receiving sensor is illuminated with light from the rear side (opposite opposite side to the wiring section), which is called a back-illuminated CMOS sensor, was developed (for example, see Japanese Unexamined Patent Application Publication No. 2003-31785).

In the CMOS sensor, however, it is known that a crystal defect in a photodiode or an interface level between a light sensing portion formed in a silicon substrate and a layer-insulation layer on an upper layer of the light sensing portion is a cause of dark current.

As shown in FIG. 13A, the interface level indicated by sign x in the drawing occur in the interface between a silicon layer 101, in which a photodiode PD is formed, and a layer-insulation layer 102 on an upper layer of the silicon layer 101. The interface level is the cause of dark current, and thus electrons generated in the interface become dark current and flow into the photodiode PD.

In order to suppress this dark current, a so-called HAD (Hole Accumulation Diode) structure was suggested. Specifically, as shown in FIG. 13B, there was suggested the HAD structure in which a p+ semiconductor region is formed by implanting p-type impurities to the vicinity of the surface of the silicon layer 101 and the p+ semiconductor region is used as a positive charge accumulation region 103 where positive charges (holes) are accumulated.

In this way, since the photodiode PD can be separated from the interface in the HAD structure in which the positive charge accumulation region 103 is formed in the interface, dark current which is the cause of the interface level can be suppressed.

However, since a p-type impurity layer which is the positive charge accumulation region is present on the photodiode PD, it is considered that the p-type impurity layer may cause the deterioration in color mixture.

That is, even when the positive charge accumulation region (p-type impurity region) is formed, photoelectric conversion electrons occur at constant probability due to the fact that the photoelectric conversion electrons propagate to the adjacent photodiode PD (see FIG. 14).

SUMMARY OF THE INVENTION

The present invention provides a solid-state imaging device, a method of manufacturing the same, and an image capturing apparatus capable of suppressing both dark current and color mixture. The invention also provides a semiconductor device and a method of manufacturing the same capable of suppressing noise of a device such as a photoelectric conversion element.

One embodiment consistent with the present invention includes a solid state imaging device including a semiconductor substrate, at least one light sensing portion with a charge accumulating portion in the semiconductor substrate, a dielectric layer over an induced layer of the semiconductor substrate adjacent to the charge accumulation portion, where the induced layer is induced by the dielectric layer.

Another embodiment consistent with the present invention includes a solid state imaging device where the dielectric layer induces a portion of the induced layer located over the at least one light sensing portion in the semiconductor substrate.

Another embodiment consistent with the present invention includes a solid state imaging device where the dielectric layer and the induced layer have a conductivity type opposite that of the sensor portion.

Another embodiment consistent with the present invention includes a solid state imaging device where an impurity concentration of the charge accumulation region is greater along a surface of the semiconductor substrate closest to the dielectric layer.

Another embodiment consistent with the present invention includes a solid state imaging device where incident light enters a side of the semiconductor substrate furthest from the dielectric layer.

Another embodiment consistent with the present invention includes a solid state imaging device where an impurity concentration of the charge accumulation region is greater along a surface of the semiconductor substrate furthest from the dielectric layer.

Another embodiment consistent with the present invention includes a solid state imaging device where the dielectric film is partially on an upper layer of the semiconductor substrate.

Another embodiment consistent with the present invention includes a solid state imaging device where the dielectric layer is comprised of a material selected from the group of hafnium, zirconium, aluminum, tantalum, titanium, yttrium and a lanthanoid.

Another embodiment consistent with the present invention includes a solid state imaging device where the dielectric layer also serves as a reflective film.

Another embodiment consistent with the present invention includes a method of manufacturing a semiconductor device, including the steps of forming at least one light sensing portion with a charge accumulating portion in a semiconductor substrate, forming an induced layer in a rear surface of the semiconductor substrate and adjacent to the charge accumulating portion, and forming a dielectric film over the induced layer.

Another embodiment consistent with the present invention includes a method of manufacturing a semiconductor device where the dielectric layer induces a portion of the induced layer located over the at least one light sensing portion in the semiconductor substrate.

Another embodiment consistent with the present invention includes a method of manufacturing a semiconductor device where the dielectric layer and the induced layer have a conductivity type opposite that of the sensor portion.

Another embodiment consistent with the present invention includes a method of manufacturing a semiconductor device where an impurity concentration of the charge accumulation region is greater along a surface of the semiconductor substrate closest to the dielectric layer.

Another embodiment consistent with the present invention includes a method of manufacturing a semiconductor device where an impurity concentration of the charge accumulation region is greater along a surface of the semiconductor substrate farthest from the dielectric layer.

Another embodiment consistent with the present invention includes a method of manufacturing a semiconductor device where the dielectric film is partially on an upper layer of the semiconductor substrate.

Another embodiment consistent with the present invention includes a method of manufacturing a semiconductor device where the dielectric layer is comprised of a material selected from the group of halfnium, zirconium, aluminum, tantalum, titanium, yttrium and a lanthanoid.

Another embodiment consistent with the present invention includes a camera including a lens, a solid state imaging device located in front of the lens which includes a semiconductor substrate, at least one light sensing portion with a charge accumulating portion in the semiconductor substrate, a dielectric layer over an induced layer of the semiconductor substrate adjacent to the charge accumulation portion, where the induced layer is induced by the dielectric layer.

Another embodiment consistent with the present invention includes a camera with a shutter device located between the lens and the solid state imaging device.

Another embodiment consistent with the present invention includes a camera where the dielectric layer induces a portion of the induced layer located over the at least one light sensing portion in the semiconductor substrate.

Another embodiment consistent with the present invention includes a camera where the dielectric layer and the induced layer have a conductivity type opposite that of the sensor portion.

Another embodiment consistent with the present invention includes a camera where an impurity concentration of the charge accumulation region is greater along a surface of the semiconductor substrate closest to the dielectric layer.

Another embodiment consistent with the present invention includes a camera where an impurity concentration of the charge accumulation region is greater along a surface of the semiconductor substrate farthest from the dielectric layer.

Another embodiment consistent with the present invention includes a camera where incident light enters a side of the semiconductor substrate furthest from the dielectric layer.

Another embodiment consistent with the present invention includes a camera where the dielectric film is partially on an upper layer of the semiconductor substrate.

Another embodiment consistent with the present invention includes a camera where the dielectric layer is comprised of a material selected from the group of halfnium, zirconium, aluminum, tantalum, titanium, yttrium and a lanthanoid.

Another embodiment consistent with the present invention includes a device, comprising a substrate, a charge accumulating region in the substrate, a dielectric layer over an induced layer of the semiconductor substrate adjacent to the charge accumulation portion, where the induced layer is induced by the dielectric layer.

Another embodiment consistent with the present invention includes a device where the dielectric layer induces a portion of the induced layer located over the at least one light sensing portion in the semiconductor substrate.

Another embodiment consistent with the present invention includes a device where the dielectric layer and the induced layer have a conductivity opposite thatof the sensor portion.

Another embodiment consistent with the present invention includes a device where an impurity concentration of the charge accumulation region is greater along a surface of the semiconductor substrate closest to the dielectric layer.

Another embodiment consistent with the present invention includes a device where an impurity concentration of the charge accumulation region is greater along a surface of the semiconductor substrate farthest from the dielectric layer.

Another embodiment consistent with the present invention includes a device where the dielectric film is partially on an upper layer of the semiconductor substrate.

Another embodiment consistent with the present invention includes a device where the dielectric layer is of a material selected from the group of halfnium, zirconium, aluminum, tantalum, titanium, yttrium and a lanthanoid.

Another embodiment consistent with the present invention includes a device where incident light enters a side of the semiconductor substrate furthest from the dielectric layer.

Another embodiment consistent with the present invention includes a device where the dielectric layer also serves as a reflective film.

The solid-state imaging device, the method of manufacturing the same, and the image apparatus according to the embodiments of the invention are capable of preventing dark current and the color mixture. Moreover, the semiconductor device and the method of manufacturing the same according to the embodiments of the invention are capable of preventing noise of the device such as the photoelectric conversion element.

BRIEF DESCRIPTION OF THE DRAWINGS

The accompanying drawings, which are incorporated in and constitute a part of this specification, illustrate an implementation of the present invention and, together with the description, serve to explain the advantages and principles of the invention. In the drawings.

DESCRIPTION OF THE PRESENTLY PREFERRED EMBODIMENTS

While various embodiments of the present invention are described herein, it will be apparent to those of skill in the art that many more embodiments and implementations are possible that are within the scope of this invention. Accordingly, the present invention is not to be restricted except in light of the attached claims and their equivalents.

Figure 1:
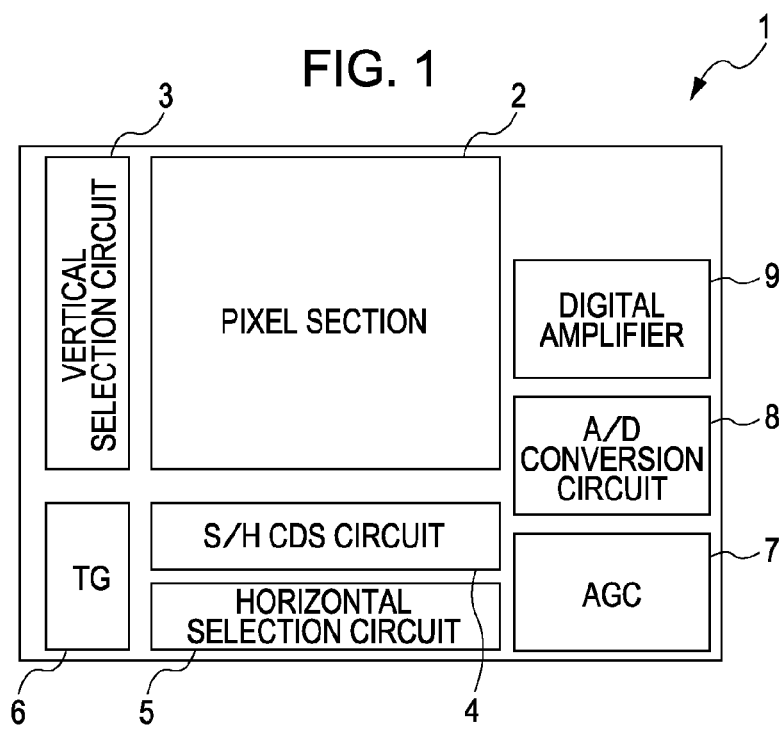
FIG. 1 is a schematic diagram illustrating a back-illuminated solid-state imaging device which is an example of a solid-state imaging device according to an embodiment of the invention.

FIG. 1 is a schematic diagram illustrating a back-illuminated solid-state imaging device which is an example of a solid-state imaging device according to an embodiment of the invention.

A solid-state imaging device 1 shown in the drawing includes a pixel section 2 and a peripheral circuit section, which are mounted on the same semiconductor substrate. According to a first embodiment, the peripheral circuit unit includes a vertical selection circuit 3, a sample hold correlated double sampling circuit (S/H CDS circuit) 4, a horizontal selection circuit 5, a timing generator (TG) 6, an AGC circuit 7, an A/D conversion circuit 8, and a digital amplifier 9.

In the pixel section 2, a plurality of unit pixels, which are described below, is disposed in a matrix form. Address lines and the like are disposed in a row unit and signal lines and the like are disposed in a column unit.

The vertical selection circuit 3 sequentially select pixels in the row unit to read signals of the respective pixels in every pixel row to the S/H CDS circuit 4 via vertical signal lines. The S/H CDS circuit 4 performs a signal process, such as CDS (Correlated Double Sampling), on the pixel signals read from the respective pixel rows.

The horizontal selection circuit 5 sequentially extracts the pixel signals retained in the S/H CDS circuit 4 and outputs the extracted pixel signals to the AGC (Automatic Gain Control) circuit 7. The AGC circuit 7 amplifies the signals input from the horizontal selection circuit 5 to an appropriate gain and outputs the amplified signals to the A/D conversion circuit 8.

The A/D conversion circuit 8 converts the analog signals input from the AGC circuit 7 into digital signals and outputs the converted digital signals to the digital amplifier 9. The digital amplifier 9 appropriately amplifies the digital signals input from the A/D conversion circuit 8 and outputs the amplified digital signals to a pad (terminal).

The operations of the vertical selection circuit 3, the S/H CDS circuit 4, the horizontal selection circuit 5, the AGC circuit 7, the A/D conversion circuit 8, and the digital amplifier 9 are performed based on various timing signals output from the timing generator 6.

Figure 2:
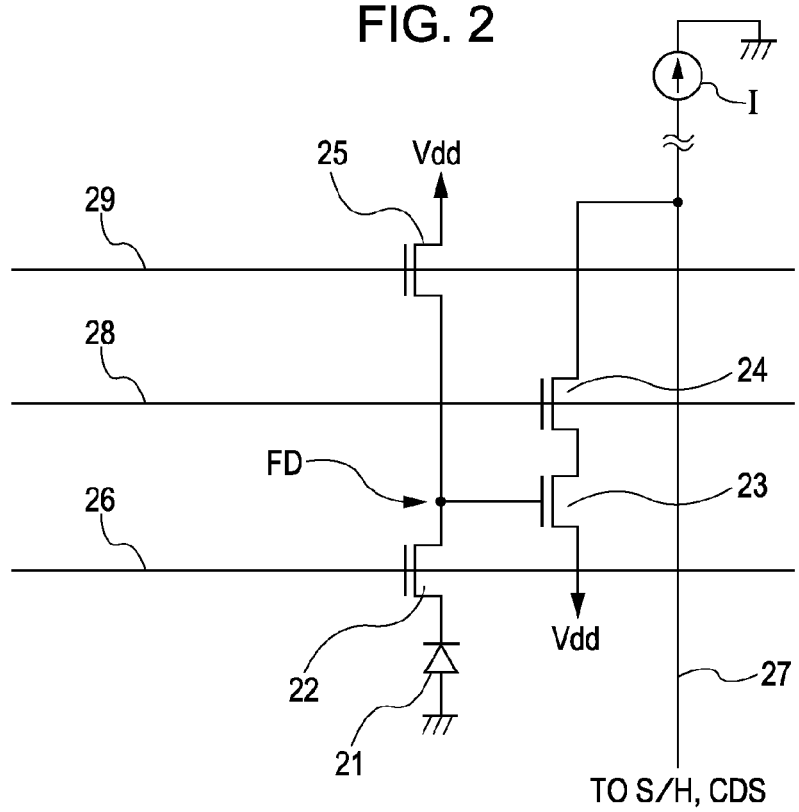
FIG. 2 is a schematic diagram illustrating an example of the circuit configuration of unit pixels in a pixel section.

FIG. 2 is a schematic diagram illustrating an example of the circuit configuration of the unit pixels in the pixel section 2.

The unit pixel includes a photodiode 21 as a photoelectric conversion element, for example. The unit pixel includes four transistors, that is, a transfer transistor 22, an amplification transistor 23, an address transistor 24, and a reset transistor 25 as active devices for one photodiode 21.

The photodiode 21 performs photoelectric conversion on incident light to charges (here, electrons) with an amount corresponding to the light quantity of the incident light. The transfer transistor 22 is connected between the photodiode 21 and a floating diffusion FD. When a driving signal is transmitted to a gate (transfer gate) of the transfer transistor via a driving wire 26, the electrons subjected to the photoelectric conversion by the photodiode 21 are transferred to the floating diffusion FD.

A gate of the amplification transistor 23 is connected to the floating diffusion FD. The amplification transistor 23 is connected to the vertical signal line 27 via the address transistor 24 and includes a constant current source I and a source follower outside the pixel section. When an address signal is transmitted to a gate of the address transistor 24 via the driving wire 28 and the address transistor 24 is turned on, the amplification transistor 23 amplifies the potential of the floating diffusion FD and outputs the voltage corresponding to the potential to the vertical signal line 27. The voltage output from the respective pixels is output to the S/H CDS circuit 4 via the vertical signal line 27.

The reset transistor 25 is connected between a power source Vdd and the floating diffusion FD. When a reset signal is transmitted to a gate of the reset transistor 25 via the driving wire 29, the potential of the floating diffusion FD is reset to the potential of the power source Vdd.

The operations are simultaneously performed for the respective pixels corresponding to one row, since the gates of the transfer transistor 22, the address transistor 24, and the reset transistor 25 are connected in a row unit.

Figure 3:
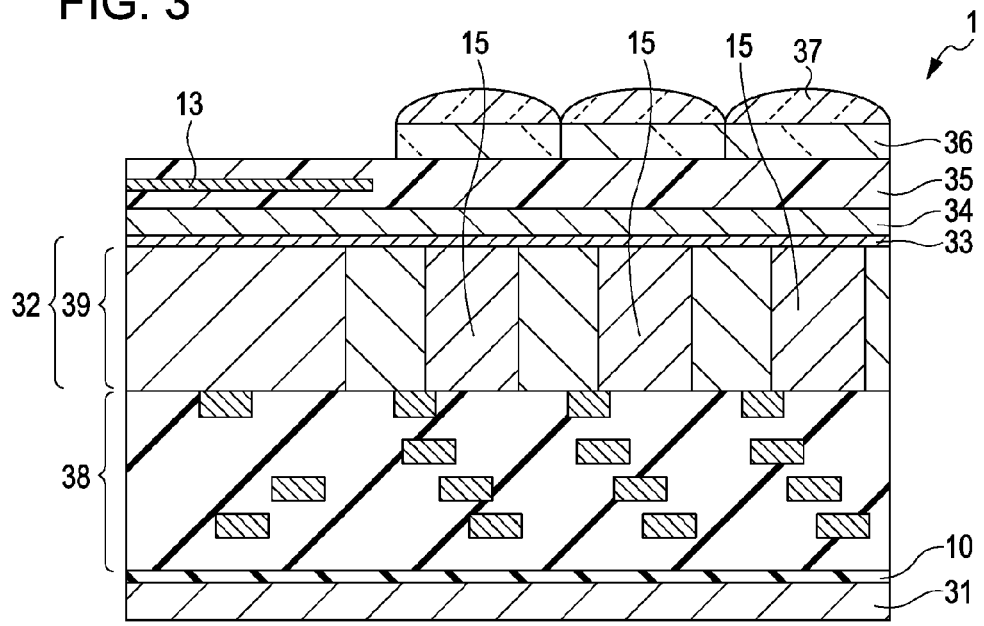
FIG. 3 is a schematic sectional view illustrating the back-illuminated solid-state imaging device which is an example of the solid-state imaging device according to the embodiment of the invention.

FIG. 3 is a schematic sectional view illustrating the back-illuminated solid-state imaging device which is an example of a solid-state imaging device according to the embodiment of the invention.

The back-illuminated solid-state imaging device receives light from the surface (hereinafter, referred to as a "rear surface" of the semiconductor substrate) opposite to the surface (hereinafter, referred to as a "front surface" of the semiconductor substrate) on which a wiring layer 38 is formed.

The solid-state imaging device 1 shown in FIG. 3 mainly includes a semiconductor supporting substrate 31, a semiconductor substrate 32, a hafnium oxide film 34, a passivation film 35, color filters 36, and micro lenses 37.

The semiconductor substrate 32 is formed of n-type silicon. The semiconductor substrate 32 includes a plurality of light sensing portions 15 including the unit pixels and a device formation layer 39 provided with an active device (not shown), such as a MOS transistor, converting signal charges subjected to the photoelectric conversion by the light sensing portions into electric signals.

The light sensing portion 15 corresponds to the photodiode 21 shown in FIG. 2 and is formed by a pn junction in the semiconductor substrate 32.

Here, the semiconductor substrate 32 is formed by forming a silicon wafer thinned so that light from the rear surface is incident.

The thickness of the semiconductor substrate 32 is about 2.5 μm depending on a kind of the solid-state imaging device. The semiconductor substrate 32 is thinned until the thickness of a region 33 entering a positive charge storage state by the hafnium oxide film 34 described below becomes the thickness of a region adjacent to an n-type charge accumulation region 41 described below.

When the thickness of the silicon wafer is large, that is, the silicon wafer is not sufficiently thinned; the device formation layer 39 is interposed between the region 33 entering the positive charge storage state by the hafnium oxide film 34 and the n-type charge accumulation region 41.

Figure 15:
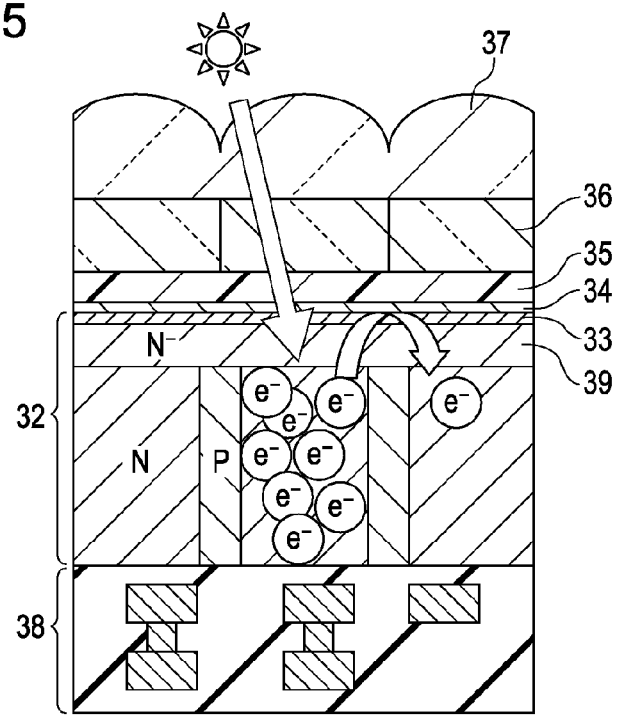
FIG. 15 is a schematic diagram illustrating the mechanism of blooming.

In this configuration, a problem may arise in that blooming deterioration occurs (see FIG. 15).

Therefore, in order to prevent blooming deterioration, it is necessary to thin the silicon wafer until the region 33 entering the positive charge storage state by the hafnium oxide film 34 and the n-type charge accumulation region 41 become adjacent to each other.

Figure 16:
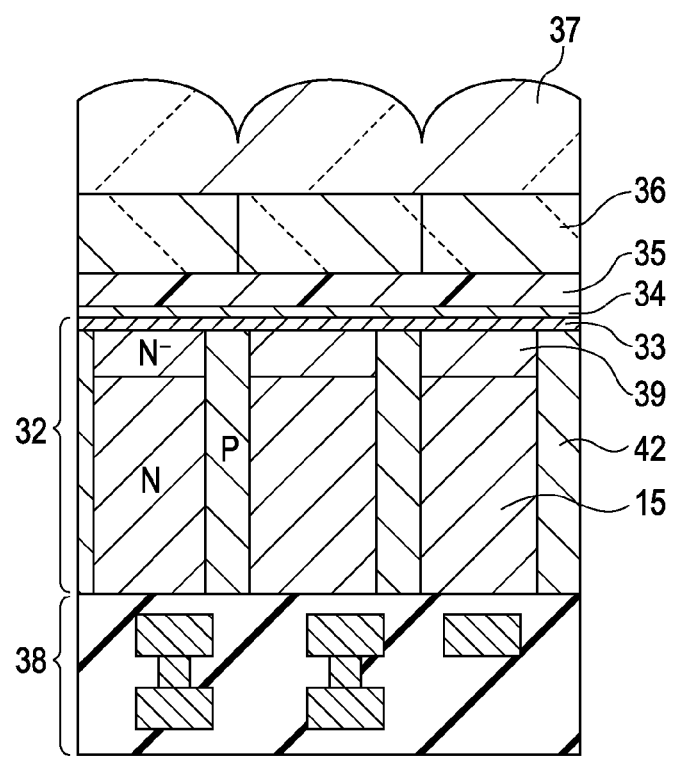
FIG. 16 is a schematic diagram illustrating a method of solving the blooming.

Alternatively, in order to prevent the blooming deterioration, it can be considered that a deep pixel isolation region 42 is formed only in a gap between the light sensing portions 15, as shown in FIG. 16. In order to form the deep pixel isolation region 42, however, it is necessary to implant ions up to a deep region. Therefore, the width of the pixel isolation region 42 is necessarily increased to perform the ion implanting process up to the deep region in consideration of the aspect ratio. In this case, the regions of the light sensing portions may be miniaturized.

According to the embodiment of the invention, in order to prevent blooming deterioration and ensure the regions of the light sensing portions, the region 33 entering the positive charge storage state by the hafnium oxide film 34 and the n-type charge accumulation region 41 are made adjacent to each other.

The wiring layer 38 electrically wiring the active devices such as the MOS transistor in several layers is formed on the front surface of the semiconductor substrate 32. The wiring layer 38 is bonded with the semiconductor supporting substrate 31 with a silicon dioxide layer 10 interposed therebetween.

The semiconductor supporting substrate 31 is used to enhance the strength of the semiconductor substrate 32. The semiconductor supporting substrate 31 is formed of, for example, a silicon substrate.

The hafnium oxide film 34 is formed on the rear surface of the semiconductor substrate 32. The hafnium oxide film 34 is an example of a dielectric film and allows the vicinity (which is a region indicated by reference numeral 33 in the drawing) of the front surface of the semiconductor substrate 32 to enter a positive charge storage state.

Figure 4:
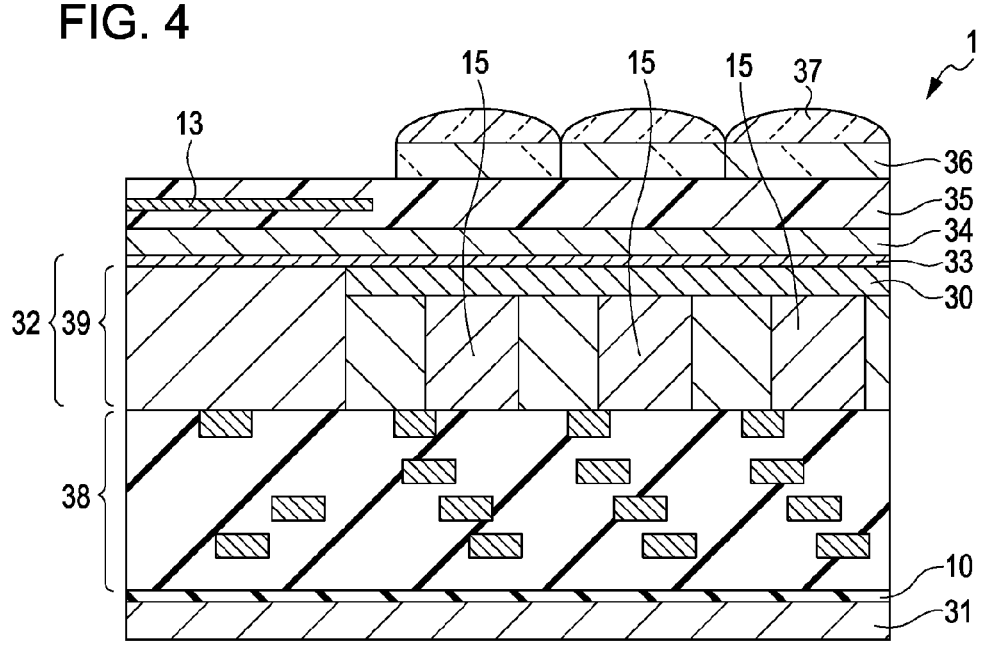
FIG. 4 is a schematic sectional view illustrating a solid-state imaging device according to a related art.

Here, in the solid-state imaging device according to a related art, as shown in FIG. 4, a p-type impurity region 30 is formed on the light sensing portions 15 in the semiconductor substrate 32. The solid-state imaging device according to the first embodiment, however, has no p-type impurity region.

However, when the thickness of the region 33 induced by the hafnium oxide film 34 is increased even in the case where no p-type impurity region 30 is formed, the color mixture may occur as in the case where the p-type impurity region 30 is formed. For this reason, the thickness of the region 33 induced by the hafnium oxide film 34 has to be 100 nm or less.

A light-shielding film 13 provided with a visible-ray introduction opening portion is formed on an upper layer of the hafnium oxide film 34 at the region corresponding to the light sensing portion. The passivation film 35 is formed on an upper layer of the light-shielding film 13.

The color filters 36 and the micro lenses 37 are formed at the region corresponding to the visible-ray introduction opening portion.

The color filters 36 perform spatial color separation using color filters (RGB Bayer arrangement) of three red (R), green (G), and blue (B) colors, for example.

By arbitrarily adjusting the spectroscopic characteristics of the color filters, satisfactory color reproduction can be achieved.

The hafnium oxide film 34 also serves as a reflection preventing film. Therefore, by forming the hafnium oxide film 34, it is not necessary to provide a separate reflection preventing film.

Figure 5:
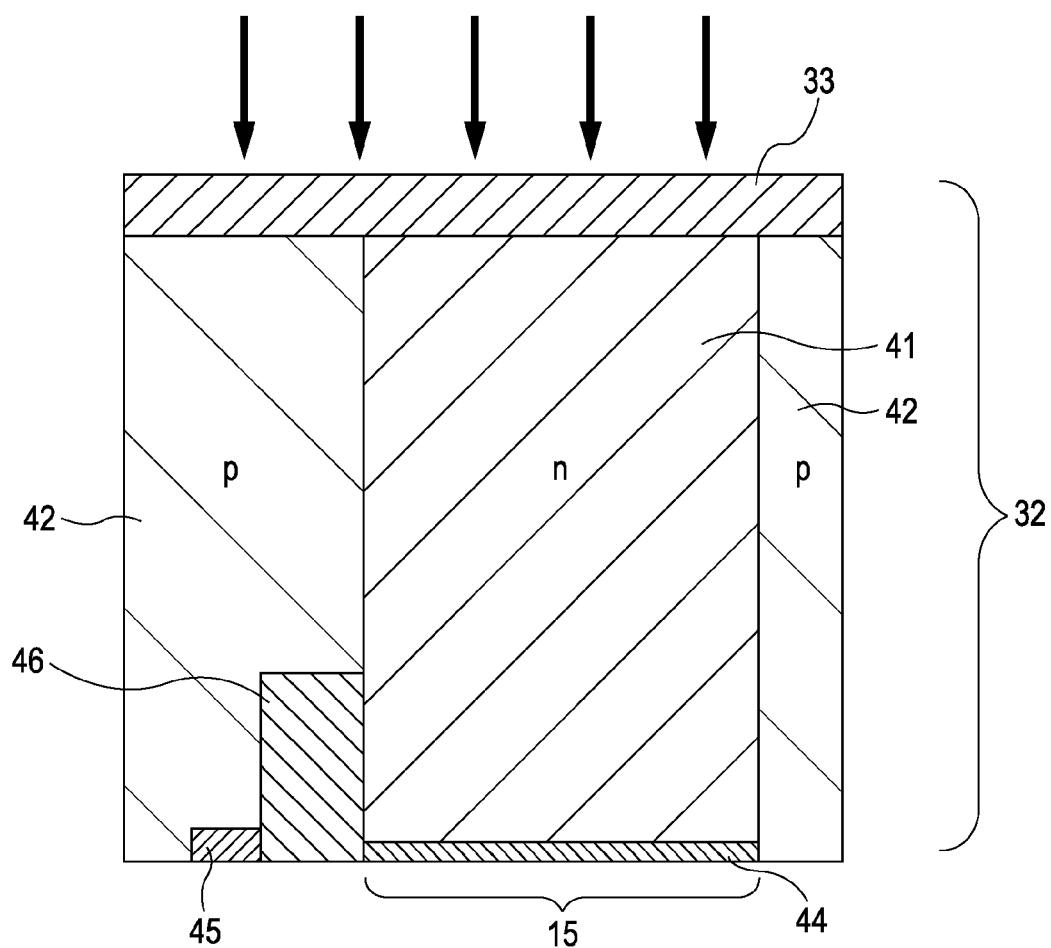
FIG. 5 is a sectional view illustrating the main units of a pixel section of a semiconductor substrate.

FIG. 5 is a sectional view illustrating the main units of the pixel section of the semiconductor substrate 32.

In the region of the light sensing portion 15, an n-type charge accumulation region 41 is formed in the semiconductor substrate 32.

In order to allow the region accumulating the signal charges to be close to the front surface of the semiconductor substrate 32, it is desirable to form the charge accumulation region 41 so that an impurity concentration is increased along the front surface of the semiconductor substrate 32.

In order to receive the incident light effectively, the charge accumulation region 41 may be formed so that the area of the charge accumulation region 41 is increased along the rear surface of the semiconductor substrate 32.

In the semiconductor substrate 32, the pixel isolation region 42 is formed in the periphery of the charge accumulation region 41. In the front surface of the semiconductor substrate 32, a shallow p-type hole accumulation region 44 is formed in the region of the light sensing portion 15.

In the front surface of the semiconductor substrate 32, an n-type floating diffusion (FD) 45 is formed. A p-type region 46 is formed between the floating diffusion 45 and the charge accumulation region 41. Therefore, the floating diffusion 45 and the charge accumulation region 41 are electrically isolated from each other.

In the first embodiment, the case where the hafnium oxide film 34 is formed on the entire surface of the semiconductor substrate 32 has been described.

However, the hafnium oxide film 34 may allow the vicinity of the front surface of the semiconductor substrate 32 to enter the positive charge storage state. Accordingly, the hafnium oxide film 34 may not be necessarily formed on the entire surface of the semiconductor substrate 32, but may be partially formed on an upper layer of the semiconductor substrate 32.

In the first embodiment, the case where the hafnium oxide film 34 is formed has been described. However, the vicinity of the front surface of the semiconductor substrate 32 may enter the positive charge storage state. Therefore, the hafnium oxide film 34 may not be necessarily formed.

As the film with negative fixed charge, not only the hafnium oxide film but also an oxide insulating film of an element selected from zirconium, aluminum, tantalum, titanium, yttrium, and a lanthanoid may be used.

In the first embodiment, since the light sensing portion 15 (the charge accumulation region 41) is the n-type region, the vicinity of the front surface of the semiconductor substrate 32 enters the positive charge storage state and the hafnium oxide film 34 is formed on an upper layer of the semiconductor substrate 32.

In contrast, when the light sensing portion 15 is a p-type region, the vicinity of the front surface of the semiconductor substrate 32 has to enter a negative charge storage state. Therefore, a dielectric film is formed on an upper layer of the semiconductor substrate 32 to allow the vicinity of the front surface of the semiconductor substrate 32 to enter the negative charge storage state.

Hereinafter, an operation of the solid-state imaging device with the above-described configuration will be described.

First, during a charge accumulation period, light incident from the rear surface of the semiconductor substrate 32 is subjected to photoelectric conversion by the light sensing portions 15, and thus the signal charges corresponding to the light quantity of the incident light. The signal charges generated by the photoelectric conversion drift in the charge accumulation region 41, are present in the charge accumulation region 41, and are accumulated near the hole accumulation region 44.

During the charge accumulation period, negative voltage is applied to a gate electrode of the transfer transistor 22. Therefore, the transfer transistor 22 is turned off.

Next, at reading time, positive voltage is applied to the gate electrode of the transfer transistor 22. Therefore, the transfer transistor 22 is turned on. As a consequence, the signal charges accumulated in the light sensing portions 15 are transferred to the floating diffusion 45.

Here, the potential of the floating diffusion 45 is varied depending on the amount of signal charge transferred to the floating diffusion 45. Then, the potential of the floating diffusion 45 is amplified by the amplification transistor 23 and the voltage corresponding to the potential is output to the vertical signal line 27.

At reset time, positive voltage is applied to a gate electrode of the resent transistor 25, and thus the floating diffusion 45 is reset at the voltage of the power source Vdd. At this time, when negative voltage is applied to the gate electrode of the transfer transistor 22, the transfer transistor 22 is turned off.

The reading operation and the reset operation are repeated during the above-described charge accumulation period.

Hereinafter, a method of manufacturing the solid-state imaging device with the above-described configuration will be described. That is, an exemplary method of manufacturing the solid-state imaging device according to the embodiment of the invention will be described.

Figure 6A:
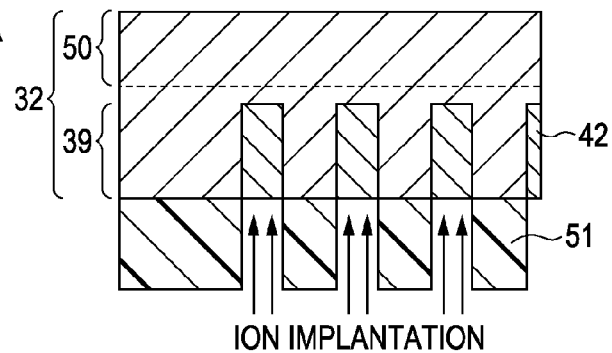
FIGS. 6A to 6D are schematic diagrams illustrating a method of manufacturing the solid-state imaging device according to the embodiment of the invention.
Figure 6B:
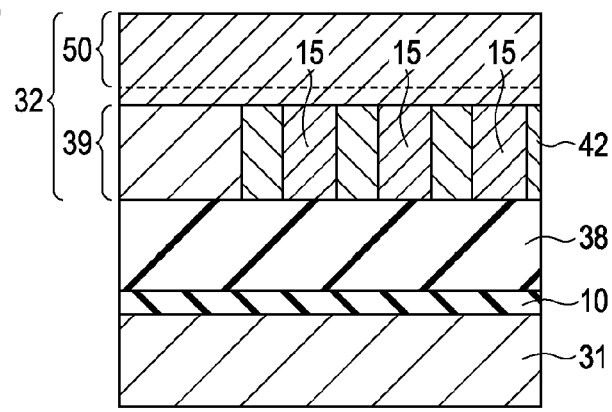

In the method of manufacturing the solid-state device according to the embodiment of the invention, as shown in FIG. 6A, a pixel isolation region forming resistor 51 is first applied to the semiconductor substrate (for example, an n-type silicon substrate) 32 including a device formation layer 39 and a thin film removal layer 50.

Next, a resistor opening region is formed by a general hotolithographic technique or an etching technique. Then, the pixel isolation region 42 is formed by an ion implanting method.

In this case, the ion implantation energy is different depending on the depth of the pixel isolation region 42. In addition, the thickness of the pixel isolation region forming resistor 51 is different depending on the ion implantation energy. That is, the thickness of the pixel isolation region forming resistor 51 is different depending on the depth of the pixel isolation region 42.

In general, the limit value of the width of the resistor opening is set in accordance with the thickness of the resistor.

Accordingly, in order to expand the light sensing portions 15 by narrowing the width of the pixel isolation region 42, it is desirable to set the optimum thickness of the resistor and the optimum width of the resistor opening in accordance with the ion implantation energy.

The n-type charge accumulation region 41, the p-type hole accumulation region 44, the floating diffusion 45, and the p-type region 46 are formed by the ion implantation method.

In FIGS. 6A to 6D, the n-type charge accumulation region 41, the p-type hole accumulation region 44, the floating diffusion 45, and the p-type region 46 are not illustrated. The formation order of the regions is not particularly limited.

Next, the wiring layer 38 is formed on the front surface of the semiconductor substrate 32 by repeatedly forming an insulating film and a wire. Thereafter, the semiconductor supporting substrate 31 formed of silicon is bonded to the wiring layer 38 with the silicon dioxide layer 10 interposed therebetween (see FIG. 6B).

Figure 6C:
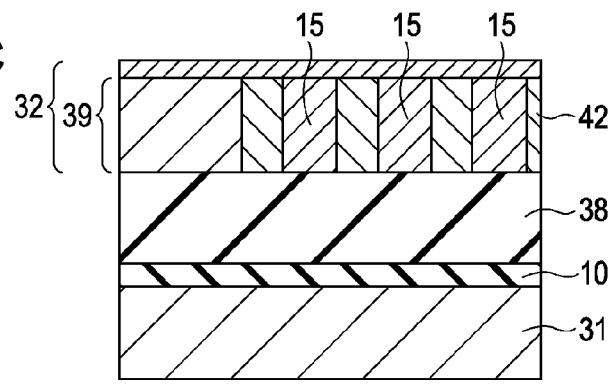

Then, as shown in FIG. 6C, the thin film removal layer 50 is removed by a CMP method, a dry etching method, or a wet etching method to thin the semiconductor substrate 32.

Specifically, for example, the semiconductor substrate 32 is thinned so as to have a thickness from 1 µm to 20 µm, and particularly, a thickness from 1 µm to 5 µm, for example, about 2.5 µm so that the region 33 entering the positive charge accumulation state by the hafnium oxide film 34 formed in a process described below has the thickness of a region adjacent to the charge accumulation region 41.

Here, any one of a semiconductor substrate formed by forming an n-type Si layer on an n-type substrate by epitaxial growth, a semiconductor substrate formed by forming an n-type Si layer on a p-type substrate by epitaxial growth, a semiconductor substrate formed by forming a p-type Si layer on an n-type substrate by epitaxial growth, and a semiconductor substrate formed by forming an p-type Si layer on a p-type substrate by epitaxial growth may be used as the semiconductor substrate 32.

However, when the thin film removal layer 50 formed of first conductive-type Si is used as a CMP stopper layer or a wet etching stopper layer to perform a removing process in accordance with a CMP method, a dry etching method, or a wet etching method, it is more desirable that a second conductive-type Si layer 39 different from the first conductive-type is formed on the first conductive-type Si substrate 50 by epitaxial growth. This is because when the semiconductor substrate 32 is subjected to back-grinding by grinding from the light emission side and then the first conductive-type Si substrate 50 is removed in accordance with the CMP method or the wet etching performed, the first conductive-type Si substrate 50 itself operates as the thin film removal layer 50 and thus becomes the CMP stopper layer or the wet etching stopper layer. Therefore, the speed of the CMP or etching is slowed, and thus a CMP time or an etching time can be easily controlled.

Specifically, when the thin film removal layer 50 formed of p-type Si is used as the CMP stopper layer or the wet etching stopper layer to perform the removing process in accordance with the CMP method, the dry etching method, or the wet etching method, it is more desirable that an n-type Si layer 39 is formed on the p-type substrate 50 by epitaxial growth. This is because after the semiconductor substrate 32 is subjected to back-grinding by grinding from the light emission side, the p-type Si substrate 50 itself operates as the thin film removal layer 50 and thus becomes the CMP stopper layer or the wet etching stopper layer in accordance with the CMP method, the dry etching method, or the wet etching method.

After the semiconductor substrate 32 is subjected to back-grinding by grinding from the light emission side and the thickness of the Si layer 39 is adjusted minutely by the CMP method, the dry etching method, or the wet etching method, the thin film removal layer 50 formed of p-type Si is removed using nitric acid or a compound liquid of nitric acid, or a part of the thin film removal layer 50 may remain.

Figure 6D:
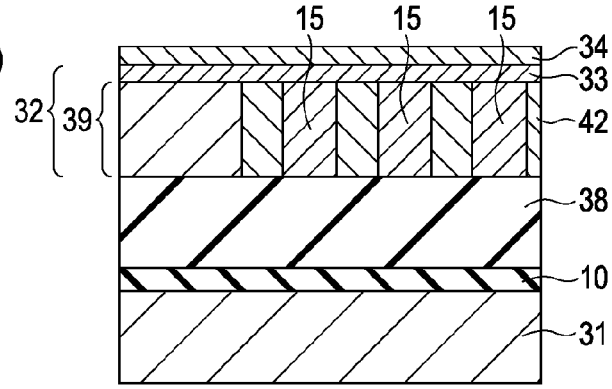

Next, the hafnium oxide film 34 is formed on the rear surface of the semiconductor substrate 32, and the region 33 with the thickness of 100 nm or less enters the positive charge accumulation state in the vicinity of the front surface of the semiconductor substrate 32 (see FIG. 6D).

The hafnium oxide film 34 is formed in accordance with an atomic layer deposition method, for example.

When the hafnium oxide film 34 is formed, a very thin silicon oxide film (not shown) is formed on the rear surface of the semiconductor substrate 32.

Next, the light-shielding film 13 is formed on the hafnium oxide film 34, and a pattern is processed to form the visible-ray introduction opening portions in the region corresponding to the light sensing portions. Then, the passivation film 35 is formed on the light-shielding film 13 in accordance with a CVD method and the color filters 36 and the micro lenses 37 are formed. In this way, the solid-state imaging device shown in FIG. 3 can be manufactured.

As for the solid-state imaging device formed in the semiconductor substrate 32 of a wafer level, the wafer can be separated into respective chips by dicing. Then, one solid-state imaging device can be obtained by mounting, bonding, and encapsulating the single chip.

In the example of the solid-state imaging device according to the embodiment of the invention, since no p-type impurity region is formed, the color mixture can be improved. Moreover, since the charge accumulation region 41 is adjacent to the region 33 induced by the hafnium oxide film 34, deterioration of blooming characteristics can be improved.

Figure 7A:
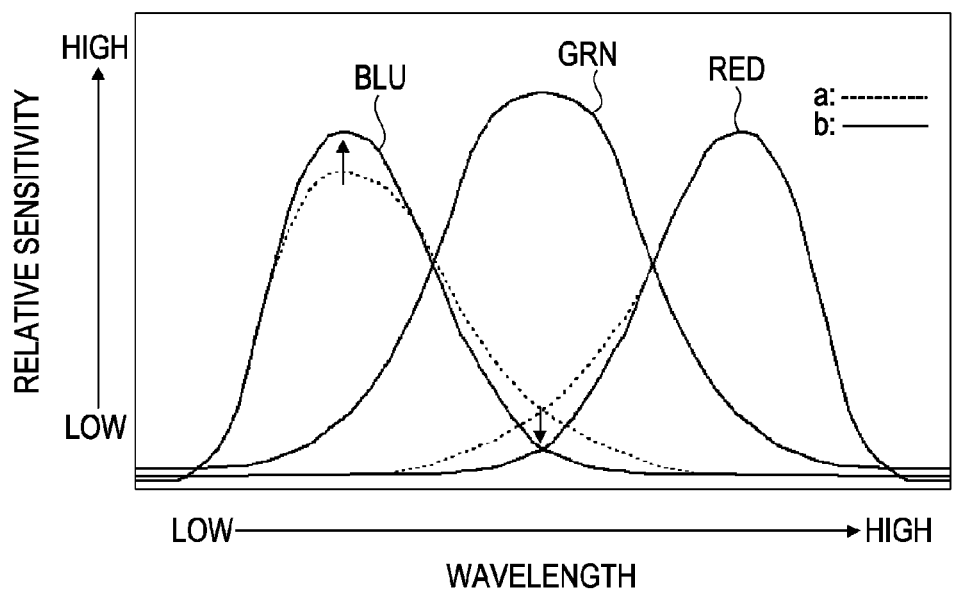
FIGS. 7A and 7B are graphs illustrating the characteristics of the solid-state imaging device according to a first embodiment.

In FIG. 7A, the relative sensitivity obtained by normalizing the peak output of green (GRN) as 100 for red (RED), green (GRN), and blue (BLU) is shown.

In the drawing, a indicates the relative sensitivity of a solid-state imaging device according to a related art in which a p-type impurity region 30 is formed. Specifically, the relative sensitivity is shown when the thickness of the p-type impurity region 30 is 500 nm. In the drawing, b indicates the relative sensitivity of the solid-state imaging device according to the first embodiment. Specifically, the thickness of the region induced by the hafnium oxide film 34 is 100 nm or less.

In the example of the solid-state imaging device according to the embodiment of the invention, as apparent from FIG. 7A, the color mixture is improved and the relative sensitivity of blue (BLU) is also improved.

Figure 7B:
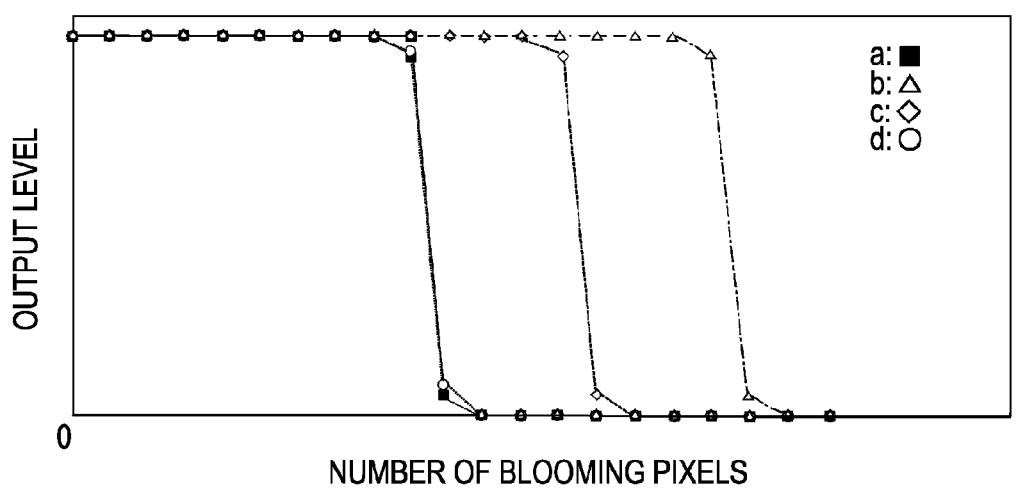

In FIG. 7B, when strong light is incident, a relationship between the distance from the pixels (indicated by "O" in the drawing) on which light is incident and an output value of leaked light is shown.

In the drawing, a indicates the solid-state imaging device (the solid-state imaging device according to a related art) in which the p-type impurity region 30 is formed, and b, c, and d indicate the solid-state imaging device in which the p-type impurity region 30 is not formed.

Specifically, in the drawing, a indicates a case where the thickness of the semiconductor substrate 32 is 3 µm and the p-type impurity region 30 with a thickness of 500 nm is formed to be adjacent to the charge accumulation region 41.

In the drawing, b indicate a case where the thickness of the semiconductor substrate 32 is 3 µm, the device formation layer 39 which is an N-layer with a thickness of 500 nm is formed to be adjacent to the charge accumulation region 41, and the region 33 entering the positive charge accumulation state is formed to be adjacent to the device formation layer 39. In the drawing, c indicates a case where the thickness of the semiconductor substrate 32 is 2.75 µm, the device formation layer 39 which is an N-layer with a thickness of 250 nm is formed to be adjacent to the charge accumulation region 41, and the region 33 entering the positive charge accumulation state is formed to be adjacent to the device formation layer 39. In the drawing, d indicates a case where the thickness of the semiconductor substrate 32 is 2.5 µm and the region 33 entering the positive charge accumulation state is formed to be adjacent to the charge accumulation region 41.

As apparent from FIG. 7B, as the thickness of the device formation layer 39 which is the N-layer is thinner, the blooming characteristics approximate those of the solid-state imaging device according to a related art in which the p-type impurity region 33 is formed. In the example of the solid-state imaging device according to the embodiment of the invention in which the N-layer is not formed, the same blooming characteristics as those of the solid-state imaging device according to a related art in which the p-type impurity region 33 is formed are realized.

Figure 8:
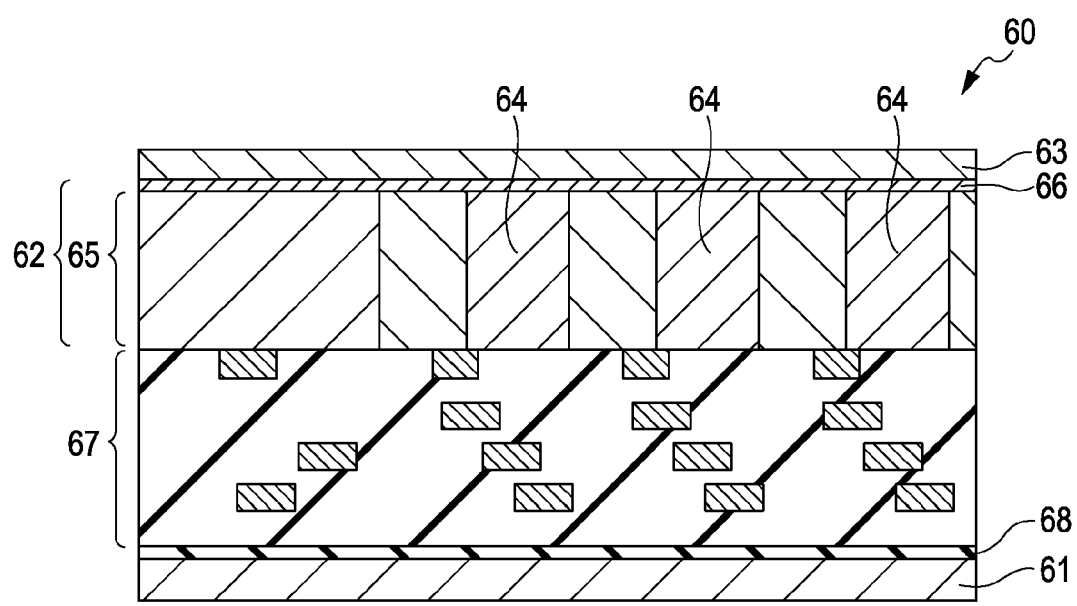
FIG. 8 is a schematic sectional view illustrating an example of a semiconductor device according to an embodiment of the invention.

FIG. 8 is a schematic sectional view illustrating an example of a semiconductor device according to an embodiment of the invention. Here, Examples of a semiconductor device 60 include a RAM, a ROM, and an LSI. The semiconductor device 60 mainly includes a semiconductor supporting substrate 61, a semiconductor substrate 62, and a hafnium oxide film 63.

The semiconductor substrate 62 is formed of n-type silicon. The semiconductor substrate 62 includes a device formation layer 65 in which n-type devices 64 such as a logic device, an active device, and a light sensing device are formed.

The device 64 has an n-type charge accumulation region (not shown).

Here, the thickness of the semiconductor substrate 62 is thinned until the thickness of a region 66 entering the positive charge accumulation state by the hafnium oxide film 63 becomes the thickness of a region adjacent to the charge accumulation region of the device 64.

A wiring layer 67 electrically wiring the devices in several layers is formed on one surface (lower surface in FIG. 8) of the semiconductor substrate 62. The wiring layer 67 is bonded with the semiconductor supporting substrate 61 with a silicon dioxide layer 68 interposed therebetween.

The semiconductor supporting substrate 61 is used to enhance the strength of the semiconductor substrate 62.

The hafnium oxide film 63 is formed on the other surface (upper surface in FIG. 8) of the semiconductor substrate 62. The hafnium oxide film 63 is an example of a dielectric film and allows the vicinity (which is a region indicated by reference numeral 66 in the drawing) of the front surface of the semiconductor substrate 62 to enter the positive charge storage state.

However, when the thickness of the region 66 induced by the hafnium oxide film 63 is increased, noise may occur, like the case where a p-type impurity region is formed to be adjacent to the charge accumulation region of the device 64. For this reason, the thickness of the region 66 induced by the hafnium oxide film 63 has to be 100 nm or less.

In the second embodiment, a case where the hafnium oxide film 63 is formed on the entire surface of the semiconductor substrate 62 will be described. However, the hafnium oxide film 63 may allow the vicinity of the front surface of the semiconductor substrate 62 to enter the positive charge accumulation state. Therefore, the hafnium oxide layer may not be formed on the entire surface of the semiconductor substrate 62. Instead, as in the first embodiment, the hafnium oxide layer may be partially formed on an upper layer of the semiconductor substrate 62.

When the vicinity of the front surface of the semiconductor substrate 62 can enter the positive charge accumulation state, the hafnium oxide film 63 may not be necessarily formed, as in the first embodiment.

In the second embodiment, when the charge accumulation region of the device 64 is the n-type region, the hafnium oxide film 63 is formed so that the vicinity of the front surface of the semiconductor substrate 62 enters the positive charge storage state. In contrast, when the charge accumulation region of the device is a p-type region, the vicinity of the front surface of the semiconductor substrate 62 has to enter a negative charge storage state. Therefore, a dielectric film is formed on an upper layer of the semiconductor substrate 62 to allow the vicinity of the front surface of the semiconductor substrate 62 to enter the negative charge storage state.

Hereinafter, a method of manufacturing the semiconductor device with the above-described configuration will be described. That is, an exemplary method of manufacturing the semiconductor device according to the embodiment of the invention will be described.

Figure 9A:
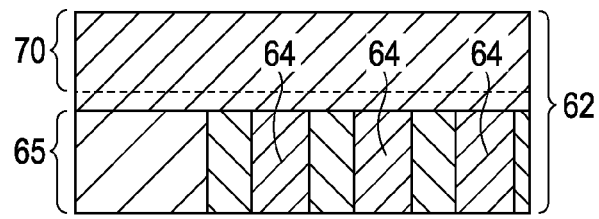
FIGS. 9A to 9C are schematic diagrams illustrating an exemplary method of manufacturing the semiconductor device according to the embodiment of the invention.

In the exemplary method of manufacturing the semiconductor device according to the embodiment of the invention, as shown in FIG. 9A, the devices 64 including the n-type charge accumulation region are formed in the semiconductor substrate 62 including the device formation layer 65 and the thin film removal layer 70.

Figure 9B:
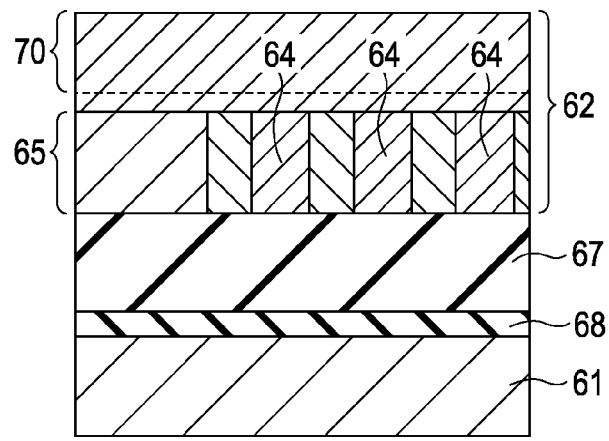

Next, the wiring layer 67 is formed on one surface of the semiconductor substrate 62 by repeatedly forming an insulating film and a wire. Thereafter, the semiconductor supporting substrate 61 formed of silicon is bonded to the wiring layer 67 with the silicon dioxide layer 68 interposed therebetween (see FIG. 9B).

Figure 9C:
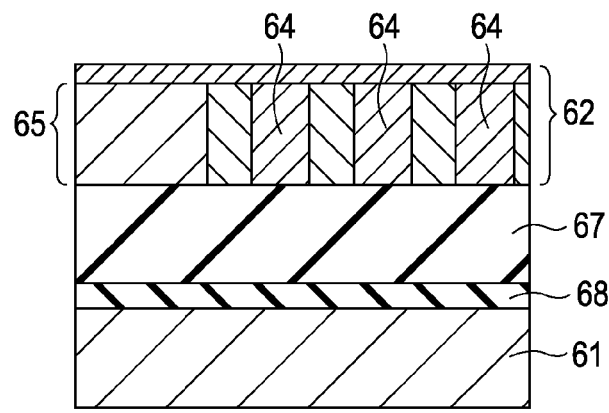

Then, as shown in FIG. 9C, the thin film removal layer is removed by a CMP method or a wet etching method to thin the semiconductor substrate 62. Specifically, for example, the semiconductor substrate 62 is thinned so as to have a thickness from 1 μm to 20 μm, and particularly, a thickness from 1 μm to 5 μm at which infrared light is subjected to photoelectric conversion in the light sensing portion, for example, about 2.5 μm so that the region 66 entering the positive charge accumulation state by the hafnium oxide film 63 formed in a process described below has the thickness of a region adjacent to the charge accumulation region of the device 64.

Here, any one of a semiconductor substrate formed by forming an n-type Si layer on an n-type substrate by epitaxial growth, a semiconductor substrate formed by forming an n-type Si layer on a p-type substrate by epitaxial growth, a semiconductor substrate formed by forming a p-type Si layer on an n-type substrate by epitaxial growth, and a semiconductor substrate formed by forming an p-type Si layer on a p-type substrate by epitaxial growth may be used as the semiconductor substrate 62.

However, when the thin film removal layer 70 formed of first conductive-type Si is used as a CMP stopper layer or a wet etching stopper layer to perform a removing process in accordance with a CMP method, a dry etching method, or a wet etching method, it is more desirable that a second conductive-type Si layer 65 different from the first conductive-type is formed on the first conductive-type Si substrate 50 by epitaxial growth. This is because when the semiconductor substrate 62 is subjected to back-grinding by grinding from the light emission side and then, when the first conductive-type Si substrate 50 is removed in accordance with the CMP method or the wet etching performed, the first conductive-type Si substrate 50 itself operates as the thin film removal layer 70 and thus becomes the CMP stopper layer or the wet etching stopper layer.

Specifically, when the thin film removal layer 70 formed of p-type Si is used as the CMP stopper layer or the wet etching stopper layer to perform the removing process in accordance with the CMP method, the dry etching method, or the wet etching method, it is more desirable that an n-type Si layer 65 is formed on the p-type substrate 50 by epitaxial growth. This is because after the semiconductor substrate 62 is subjected to back-grinding by grinding from the light emission side, the p-type Si substrate 50 itself operates as the thin film removal layer 70 and thus becomes the CMP stopper layer or the wet etching stopper layer in accordance with the CMP method, the dry etching method, or the wet etching method.

After the semiconductor substrate 62 is subjected to back-grinding by grinding from the light emission side and the thickness of the Si layer 65 is adjusted minutely by the CMP method, the dry etching method, or the wet etching method, the thin film removal layer 70 formed of p-type Si is removed using nitric acid or a mixed liquid of hydrofluoric acid and nitric acid, or a part of the thin film removal layer 70 may remain.

Next, the hafnium oxide film 63 is formed on the other surface of the semiconductor substrate 62, and the region 66 with the thickness of 100 nm or less enters the positive charge accumulation state in the vicinity of the front surface of the semiconductor substrate 62. In this way, the semiconductor device shown in FIG. 8 can be manufactured. Here, the hafnium oxide film 63 is formed in accordance with an atomic layer deposition method, for example.

As for the semiconductor device formed in the semiconductor substrate 62 of a wafer level, the wafer can be separated into respective chips by dicing. Then, one semiconductor device can be obtained by mounting, bonding, and encapsulating the single chip.

In the example of the semiconductor device according to the embodiment of the invention, since no p-type impurity region is formed, noise of the device caused due to existence of the p-type impurity region can be prevented. Moreover, since the thickness of the region 66 induced by the hafnium oxide film 63 is 100 nm or less. Therefore, even when the region 66 is induced in the positive charge accumulation state, it is difficult to generate noise.

Figure 10:
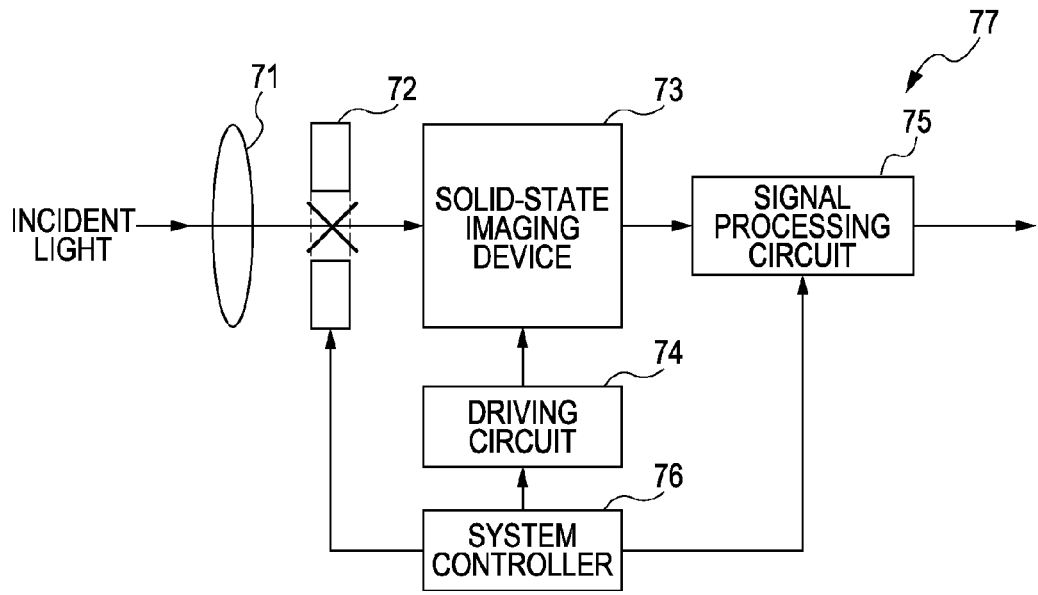
FIG. 10 is a schematic diagram illustrating a camera as an example of an image capturing apparatus according to an embodiment of the invention.

FIG. 10 is a schematic diagram illustrating a camera 77 as an example of an image capturing apparatus according to an embodiment of the invention. In a camera 77 shown in the drawing, the solid-state imaging device according to the above-described first embodiment is used as an imaging device.

In the camera 77 according to the embodiment of the invention, light from a subject (not shown) is incident to an image-formed area of a solid-state imaging device 73 via an optical system, such as a lens 71, and a mechanical shutter 72. The mechanical shutter 72 blocks the light in the image-formed area of the solid-state imaging device 73 to determine an exposure time.

Here, the solid-state imaging device 1 according to the above-described first embodiment is used as the solid-state imaging device 73. The solid-state imaging device 73 is driven by a driving circuit 74 including a timing generation circuit or a driving system.

A signal output from the solid-state imaging device 73 is subjected to various signal processes by a signal processing circuit 75 in the next stage, the signal is derived as an imaging signal to the outside, and then the derived imaging signal is stored in a storage medium such as a memory or is output to a monitor.

Closing and opening control of the mechanical shutter 72, control of the driving circuit 74, control of the signal processing circuit 75, and the like are performed by a system controller 76.

The solid-state imaging device 1 according to the above-described embodiment of the invention is used in the camera according to this embodiment of the invention. Therefore, since both the color mixture and the blooming characteristics can be improved, a high-quality picked-up image can be obtained.

In the above-described first embodiment, the case where the color filters 36 arranged in the form of RGB Bayer are used has been described. However, an organic photoelectric conversion film may be used to improve the color reproduction and realize the solid-state imaging device 1 with high precision.

Figure 11:
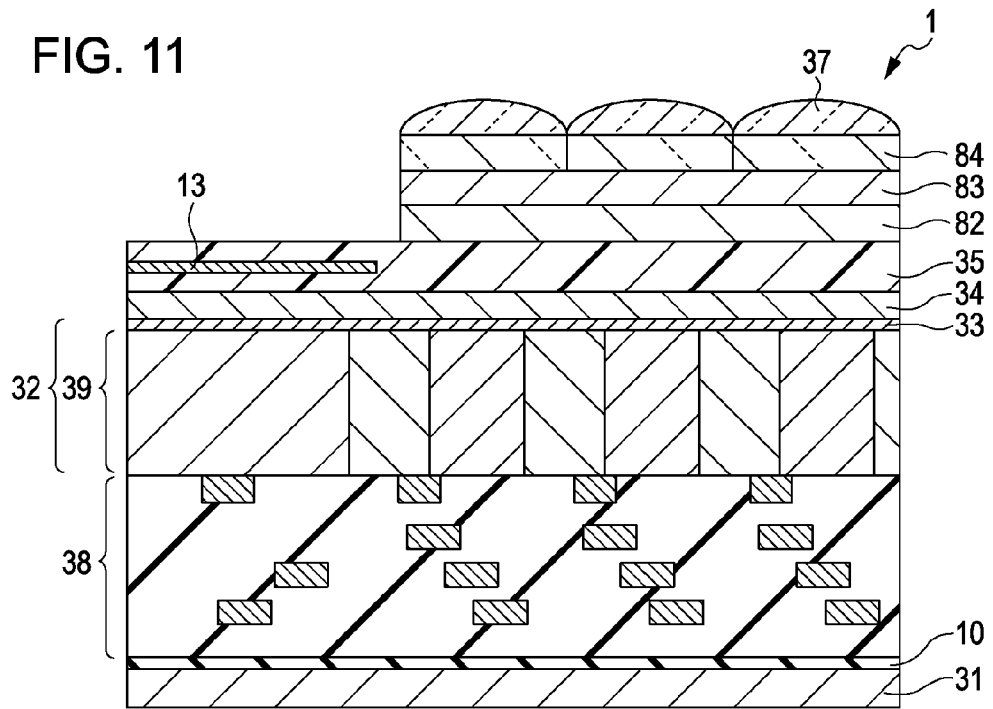
FIG. 11 is a schematic diagram illustrating the solid-state imaging device according to a modified example of the first embodiment.

FIG. 11 is a schematic diagram illustrating the solid-state imaging device according to a modified example of the first embodiment. In the solid-state imaging device 1 shown in the drawing, an organic photoelectric conversion film 82 is further formed on an upper layer of the passivation film 35, and organic color filter layers 84 are formed with a separation layer 83 interposed therebetween.

The organic color filters 84 are formed to correspond to the light sensing portions 15 and extracts blue (B) and red (R), for example. Therefore, the organic color filters 84 are formed by arranging a cyan organic color filter layer 84C and a yellow organic color filter layer 84Y in a checked pattern. The micro lenses 37 are formed on the organic color filter layers 84, respectively, to concentrate the incident light on the respective light sensing portions 15.

Examples of green (G)-based pigment of the organic photoelectric conversion film 82 include rhodamine-based pigment, phthalocyanine derivative, quinacridone, eosin Y, and melacyanine-based pigment.

The solid-state imaging device 1 according to a modified example extracts a signal from the green (G) organic photoelectric conversion film 82 and extracts blue (B) and red (R) from the combination of the cyan and yellow organic color filter layers 84.

Hereinafter, an example of the planar arrangement (coding) of the organic photoelectric conversion film 82 and the organic color filter layers 84 will be described with reference to FIGS. 12A and 12B.

Figure 12A:
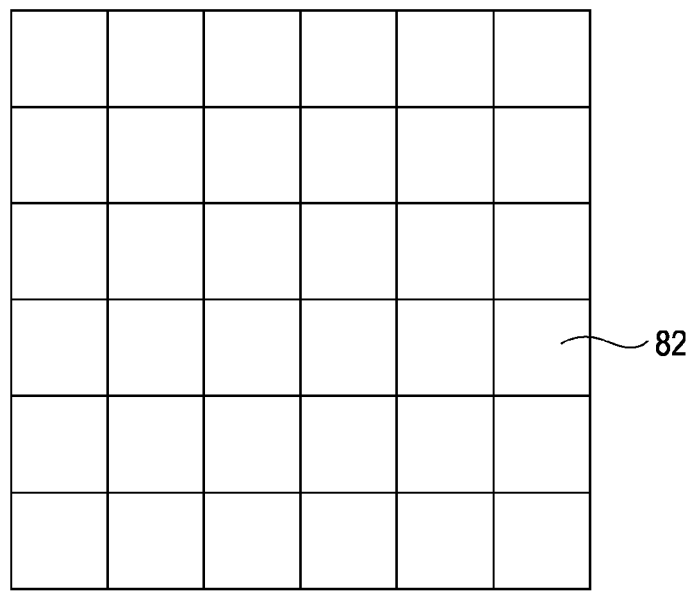
FIGS. 12A and 12B are schematic diagrams illustrating a planar arrangement (coding) of an organic photoelectric conversion film and an organic color filter layer.
Figure 12B:
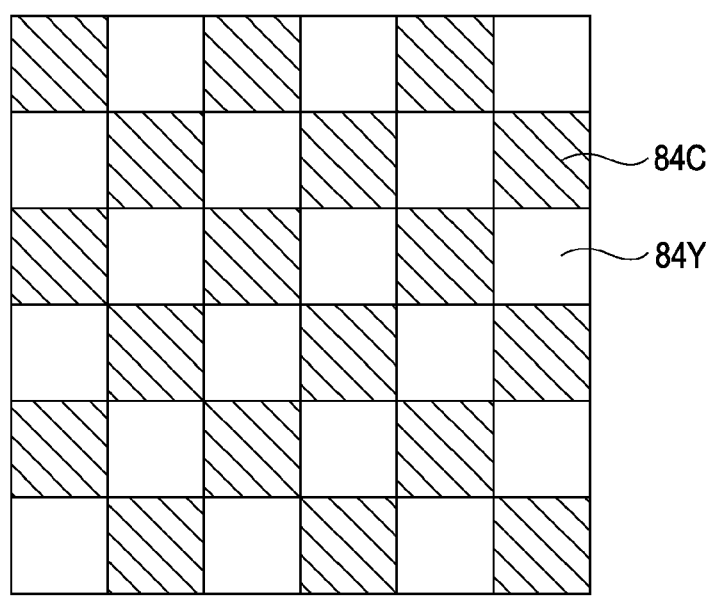
Figure 13A:
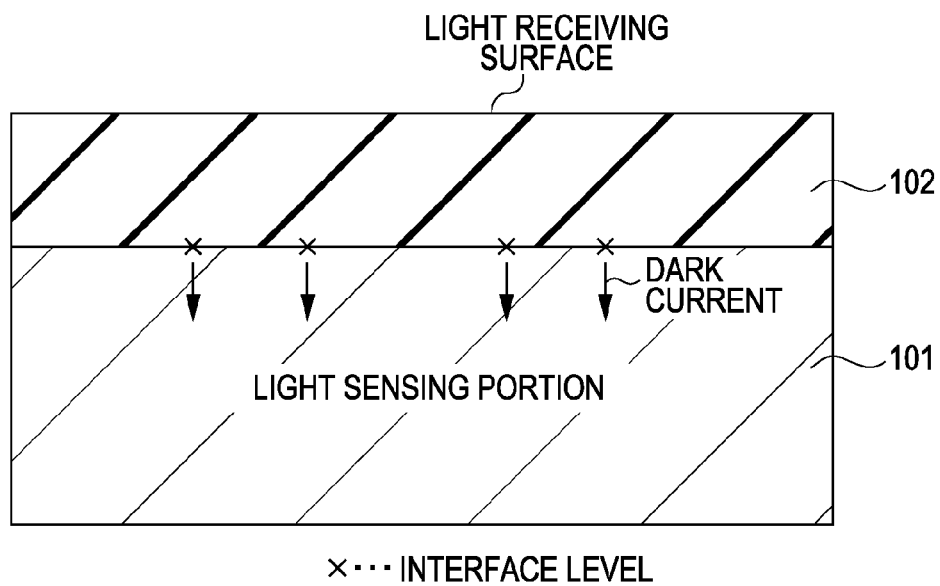
FIGS. 13A and 13B are schematic diagrams illustrating occurrence of dark current and a method of solving dark current.
Figure 13B:
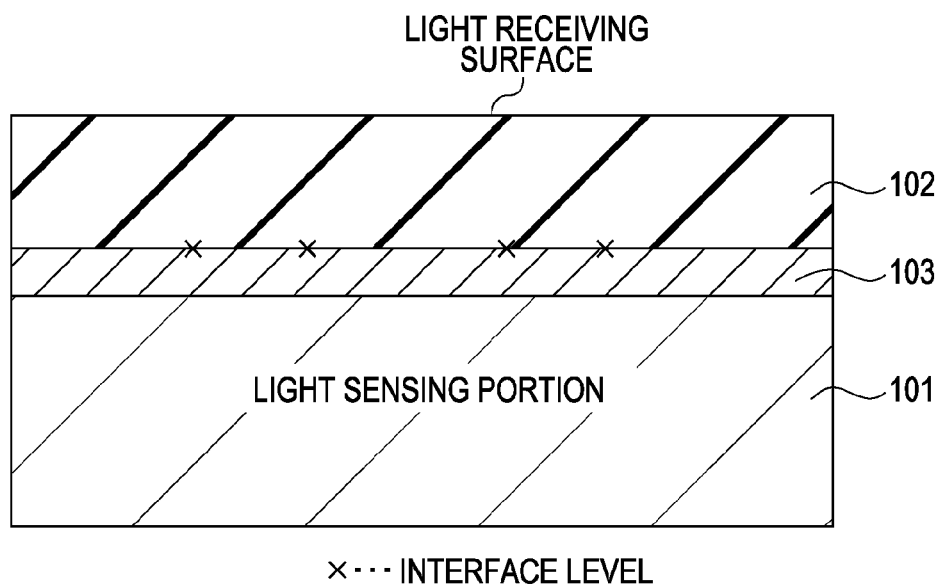
Figure 14:
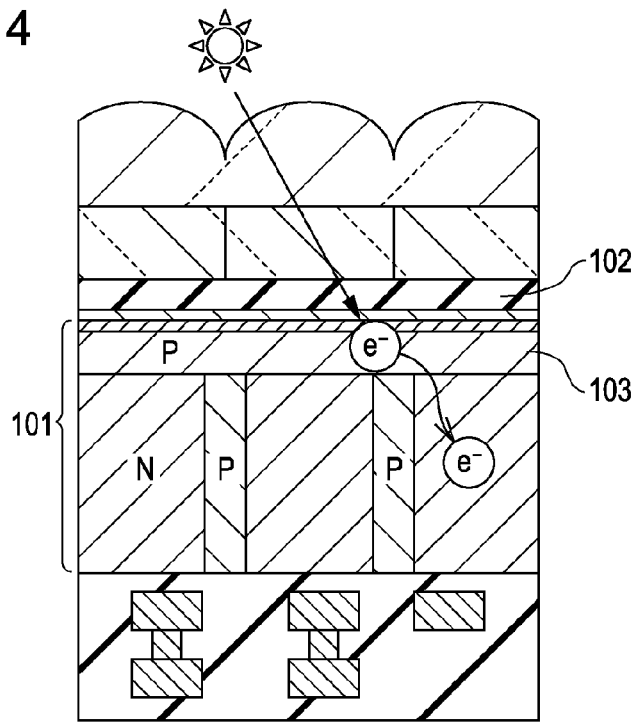
FIG. 14 is a schematic diagram illustrating the occurrence mechanism of color mixture.

As shown in FIG. 12A, green (G) of the organic photoelectric conversion film 82 is arranged in all pixels. As shown in FIG. 12B, cyan and yellow are arranged in a so-called checked pattern. The dispersion of blue (B) and red (R) is achieved by the following principle.

That is, a red (R) component is removed by absorption of the cyan organic color filter layer 84C, a green (G) component is removed by absorption of the green organic photoelectric conversion film 82, and thus blue (B) can be extracted from the remaining blue (B) component.

On the other hand, the blue (B) component is removed by absorption of the yellow organic color filter layer 84Y, the green (G) component is removed by absorption of the green (G) organic photoelectric conversion film 82, and thus red (R) can be extracted from the red (R) component.

With such a configuration, separated color signals of green (G), blue (B), and red (R) can be output.

Since the cyan organic color filter layer 84C and the yellow organic color filter layer 84Y are arranged in the so-called checked pattern, spatial luminance or chromatic resolution are slightly reduced. However, the color reproduction can be considerably improved.

In the above-described first embodiment, the case where the entire n-type silicon substrate is used has been described. However, the entire n-type silicon substrate may not be used. Instead, an SOI substrate having a configuration in which an oxide film is interleaved in the semiconductor substrate may be used.

The semiconductor substrate may be a type other than an n-type semiconductor substrate. Instead, the solid-state imaging device may be manufactured by using a p-type semiconductor substrate and implanting n-type impurities into the regions corresponding to the light sensing portions 15.

It should be understood by those skilled in the art that various modifications, combinations, sub-combinations and alterations may occur depending on design requirements and other factors insofar as they are within the scope of the appended claims or the equivalents thereof.

What is claimed is:

1. A solid state imaging device including:
a semiconductor substrate;
a light sensing portion in the semiconductor substrate;
an n-type charge accumulation region in the light sensing portion;
a p-type charge accumulation region on one surface of the semiconductor substrate;
an oxide film formed on another surface of the semiconductor substrate; and
a region that is formed in at least a portion of the semiconductor substrate by the oxide film and that is a positive charge store, wherein the region that is a positive charge store and the n-type charge accumulation region are adjacent to each other, wherein an impurity concentration of the n-type charge accumulation region is greater along a surface of the semiconductor substrate closest to the oxide film, and wherein incident light enters a side of the semiconductor substrate furthest from the oxide film.

2. The solid state imaging device of claim 1, wherein the oxide film is a dielectric layer that induces a portion of the region that is a positive charge store located over the light sensing portion in the semiconductor substrate.

3. The solid state imaging device of claim 1, wherein the oxide film and the region that is a positive charge store have a conductivity type opposite that of the sensor portion.

4. The solid state imaging device of claim 1, wherein an impurity concentration of the n-type charge accumulation region is greater along a surface of the semiconductor substrate furthest from the oxide film.

5. The solid state imaging device of claim 1, wherein the oxide film is partially on an upper layer of the semiconductor substrate.

6. The solid state imaging device of claim 1, wherein the oxide film is comprised of a material selected from the group of halfnium, zirconium, aluminum, tantalum, titanium, yttrium and a lanthanoid.

7. The solid state imaging device of claim 1, wherein the oxide film also serves as a reflective film.

8. A camera including:
a lens; and
a solid state imaging device located in front of the lens which includes a semiconductor substrate, a light sensing portion in the semiconductor substrate;
an n-type charge accumulation region in the light sensing portion;
a p-type charge accumulation region on one surface of the semiconductor substrate;
an oxide film formed on another surface of the semiconductor substrate, wherein incident light enters a side of the semiconductor substrate furthest from the oxide film; and
a region that is formed in at least a portion of the semiconductor substrate by the oxide film and that is a positive charge store, wherein the region that is a positive charge store and the n-type charge accumulation region are adjacent to each other.

9. The camera of claim 8, including a shutter device located between the lens and the solid state imaging device.

10. The camera of claim 8, wherein the oxide film is a dielectric layer that induces a portion of the region that is a positive charge store located over the light sensing portion in the semiconductor substrate.

11. The camera of claim 8, wherein the oxide film and the region that is a positive charge store have a conductivity type opposite that of the sensor portion.

12. The camera of claim 8, wherein an impurity concentration of the n-type charge accumulation region is greater along a surface of the semiconductor substrate closest to the oxide film.

13. The camera of claim 8, wherein an impurity concentration of the n-type charge accumulation region is greater along a surface of the semiconductor substrate farthest from the oxide film.

14. The camera of claim 8, wherein the oxide film is partially on an upper layer of the semiconductor substrate.

15. The camera of claim 8, wherein the oxide film is comprised of a material selected from the group of halthium, zirconium, aluminum, tantalum, titanium, yttrium and a lanthanoid.

16. A device, comprising:
a substrate;
an n-type charge accumulating region in the substrate; and
a p-type charge accumulating region on one surface of the substrate;
an oxide film formed on another surface of the substrate adjacent to the n-type charge accumulating region;
an induced layer formed in at least a portion of the substrate, wherein the induced layer is induced by the oxide film, wherein the induced layer is a positive charge store, wherein the induced layer and the n-type charge accumulating region are adjacent to each other, wherein the oxide film is a dielectric layer, wherein incident light enters a side of the semiconductor substrate furthest from the dielectric layer.

17. The device of claim 16, wherein the oxide film induces a portion of the induced layer located over the at least one light sensing portion in the substrate.

18. The device of claim 16, wherein the oxide film and the induced layer have a conductivity opposite that of a sensor portion.

19. The device of claim 16, wherein an impurity concentration of the n-type charge accumulating region is greater along a surface of the semiconductor substrate closest to the oxide film.

20. The device of claim 16, wherein an impurity concentration of the n-type charge accumulating region is greater along a surface of the semiconductor substrate farthest from the oxide film.

21. The device of claim 16, wherein the oxide film is partially on an upper layer of the semiconductor substrate.

22. The device of claim 16, wherein the oxide film is of a material selected from the group of halfnium, zirconium, aluminum, tantalum, titanium, yttrium and a lanthanoid.

23. The device of claim 16, wherein the dielectric layer also serves as a reflective film.

* * * * *